(12) United States Patent
Oh et al.

(10) Patent No.: US 10,996,711 B2
(45) Date of Patent: May 4, 2021

(54) DISPLAY DEVICE AND ELECTRONIC APPARATUS HAVING THE SAME

(71) Applicant: Samsung Display Co., Ltd., Yongin-Si (KR)

(72) Inventors: Young-Rok Oh, Hwaseong-si (KR); Minsu Jung, Hwaseong-si (KR); Mansoo Kim, Asan-si (KR); Byung Jin Park, Seongnam-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/699,766

(22) Filed: Dec. 2, 2019

(65) Prior Publication Data

US 2020/0218309 A1    Jul. 9, 2020

(30) Foreign Application Priority Data

Jan. 3, 2019 (KR) .................. 10-2019-0000690

(51) Int. Cl.
| | |
|---|---|
| *G06F 1/16* | (2006.01) |
| *G02F 1/135* | (2006.01) |
| *G02F 1/1339* | (2006.01) |
| *H01L 51/52* | (2006.01) |
| *H01L 27/32* | (2006.01) |
| *G02F 1/1335* | (2006.01) |

(52) U.S. Cl.
CPC ............ *G06F 1/1607* (2013.01); *G02F 1/135* (2013.01); *G02F 1/1339* (2013.01); *G02F 1/133514* (2013.01); *H01L 27/322* (2013.01); *H01L 51/5253* (2013.01); *H01L 51/5284* (2013.01); *G02F 2001/1351* (2013.01)

(58) Field of Classification Search
CPC ...... G06F 1/1607; G02F 1/135; G02F 1/1339; G02F 1/133514; G02F 2001/1351; H01L 51/5284; H01L 51/5253; H01L 27/322
See application file for complete search history.

(56) References Cited

U.S. PATENT DOCUMENTS

| | | | |
|---|---|---|---|
| 9,199,842 B2 | 12/2015 | Dubrow et al. | |
| 10,228,589 B2 | 3/2019 | Yang | |
| 10,775,665 B2* | 9/2020 | Lee | .......... G02B 1/18 |
| 10,804,485 B2* | 10/2020 | Kwon | .......... H01L 27/323 |
| 2013/0242228 A1* | 9/2013 | Park | .......... G02F 1/133617 349/61 |

(Continued)

FOREIGN PATENT DOCUMENTS

| | | |
|---|---|---|
| KR | 10-1646898 B1 | 8/2016 |
| KR | 10-1647490 B1 | 8/2016 |
| KR | 10-2017-0061312 A | 6/2017 |

*Primary Examiner* — Victor A Mandala
(74) *Attorney, Agent, or Firm* — Innovation Counsel LLP

(57) ABSTRACT

A display device includes a display panel including a display surface in which an active area configured to display an image and a peripheral area disposed adjacent to the active area are defined, a light source configured to provide a light to the display panel, an optical member disposed between the light source and the display panel, a light blocking layer covering a side surface of the optical member, a support member supporting the optical member, and an intermediate protective member disposed between the display panel and the light source to support the display panel. The support member is supported by the intermediate protective member.

19 Claims, 13 Drawing Sheets

(56) References Cited

U.S. PATENT DOCUMENTS

| | | | |
|---|---|---|---|
| 2014/0312339 A1* | 10/2014 | Fujita | H01L 27/322 257/40 |
| 2016/0187709 A1 | 6/2016 | Lee et al. | |
| 2017/0205645 A1* | 7/2017 | Kang | G02F 1/134363 |
| 2017/0242287 A1* | 8/2017 | Park | G02F 1/133308 |
| 2019/0064589 A1* | 2/2019 | Park | G02F 1/133608 |
| 2019/0155088 A1* | 5/2019 | Lee | G02F 1/133602 |
| 2019/0204498 A1* | 7/2019 | Lee | H04M 1/0266 |
| 2019/0204639 A1* | 7/2019 | Wu | G02F 1/133308 |
| 2019/0212489 A1* | 7/2019 | Xu | G02B 6/0088 |

* cited by examiner

DISPLAY DEVICE AND ELECTRONIC APPARATUS HAVING THE SAME

CROSS-REFERENCE TO RELATED APPLICATION

This U.S. non-provisional patent application claims priority under 35 U.S.C. § 119 of Korean Patent Application No. 10-2019-0000690, filed on Jan. 3, 2019, the contents of which are hereby incorporated by reference in its entirety.

BACKGROUND

1. Field of Disclosure

The present disclosure relates to a display device and an electronic apparatus having the same. More particularly, the present disclosure relates to a display device having a narrow bezel and an electronic apparatus having the display device.

2. Description of the Related Art

A display device includes a protective member that protects a display panel and various components required to drive the display panel. The protective member protects the display panel and forms an exterior of the display device. As development in the field of display devices allows a bezel surrounding a display surface of the display panel to decrease in width, a visibility of an image displayed through the display surface is improved, and the aesthetics of the display device are improved.

SUMMARY

The present disclosure provides a display device having a narrow bezel and an improved assemblability.

The present disclosure provides an electronic apparatus having the above display device.

Embodiments of the inventive concept provide a display device including a display panel including a display surface in which an active area configured to display an image and a peripheral area disposed adjacent to the active area are defined, a light source configured to provide a light to the display panel, an optical member disposed between the light source and the display panel, a light blocking layer covering a side surface of the optical member, a support member supporting the optical member, and an intermediate protective member disposed between the display panel and the light source to support the display panel. The support member is supported by the intermediate protective member.

The support member includes a first portion covering a portion of an upper surface of the optical member and a second portion connected to the first portion and extending along the side surface of the optical member, and the light blocking layer faces the first portion.

The support member further includes a third portion connected to the second portion and substantially parallel to the first portion, and at least a portion of the optical member is inserted into a predetermined space defined by the first portion, the second portion, and the third portion.

The third portion is optically transparent.

The display device further includes an adhesive member disposed on the second portion to make contact with the light blocking layer, and the adhesive member couples the support member and the optical member.

The support member further includes a pattern portion disposed on a rear surface of the first portion.

The light blocking layer has a black color.

The light blocking layer is configured to reflect a light incident thereto.

The light blocking layer is printed or coated on the side surface of the optical member.

The optical member includes a wavelength conversion panel, and the light blocking layer covers a side surface of the wavelength conversion panel.

The wavelength conversion panel includes a glass substrate.

The optical member further includes a diffusion panel disposed between the wavelength conversion panel and the light source, and the light blocking layer covers the side surface of the wavelength conversion panel and a side surface of the diffusion panel.

The light source is configured to generate a blue color light.

The side surface of the optical member overlaps with the active area when viewed in a plan view.

Embodiments of the inventive concept provide an electronic apparatus including a plurality of display devices arranged adjacent to each other. Each of the display devices includes a display panel including an active area configured to display an image and a peripheral area disposed adjacent to the active area, a light source configured to provide a first light to the display panel, and an optical unit disposed between the light source and the display panel. The optical unit includes an optical member configured to convert the first light to a second light having a different color from the first light, a support member supporting the optical member such that the optical member is spaced apart from the light source by a predetermined gap, and a light blocking layer covering a side surface of the optical member.

The support member includes a first portion covering a portion of an upper surface of the optical member, a second portion covering the side surface of the optical member, and a third portion covering a portion of a rear surface of the optical member, and at least a portion of the optical member is inserted into a predetermined space defined by the first portion, the second portion, and the third portion.

The third portion is optically transparent.

The optical unit further includes an adhesive member to couple the support member and the optical member. The support member includes a first portion covering a portion of an upper surface of the optical member and a second portion covering the side surface of the optical member, and the adhesive member is coupled to the second portion.

The light blocking layer has a black color.

The light blocking layer is directly disposed on the side surface of the optical member.

According to the above, the display device may have the narrow bezel, and thus the display device may have improved aesthetics and reliability.

In addition, in the display device having the narrow bezel, the structure that prevents a light leakage phenomenon from occurring and uniformly provides the light to the display panel may be implemented, and as a result, a uniform quality image may be displayed on the entire active area.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1A:
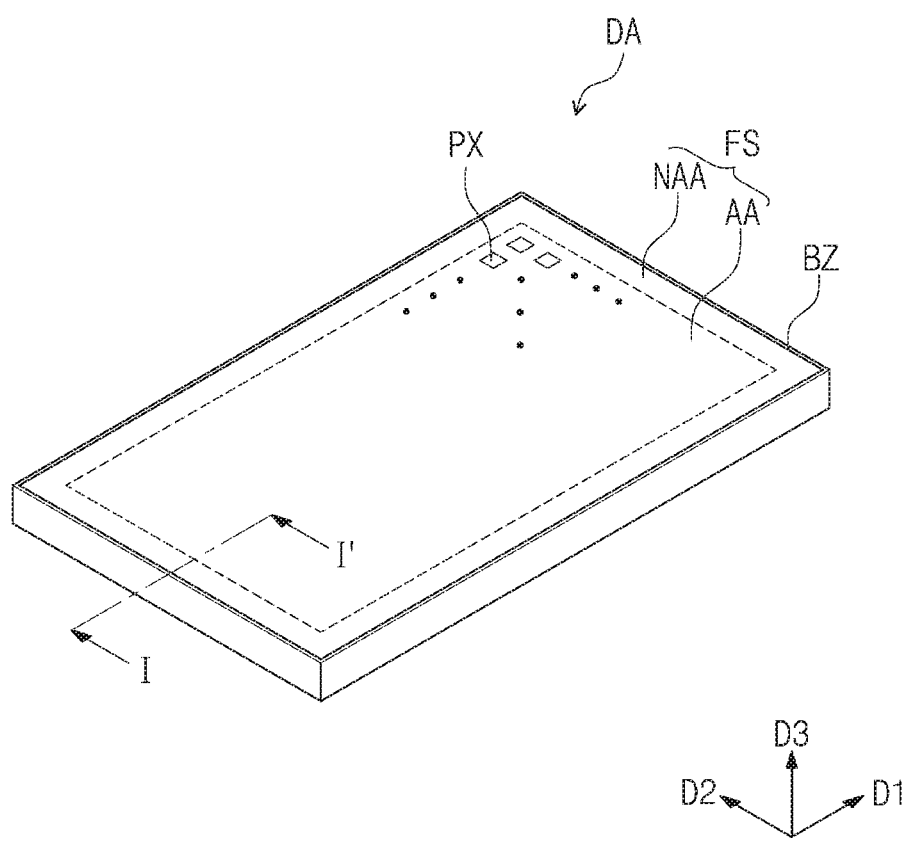
FIG. 1A is an assembled perspective view showing a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in detail with reference to the accompanying drawings.

Figure 1B:
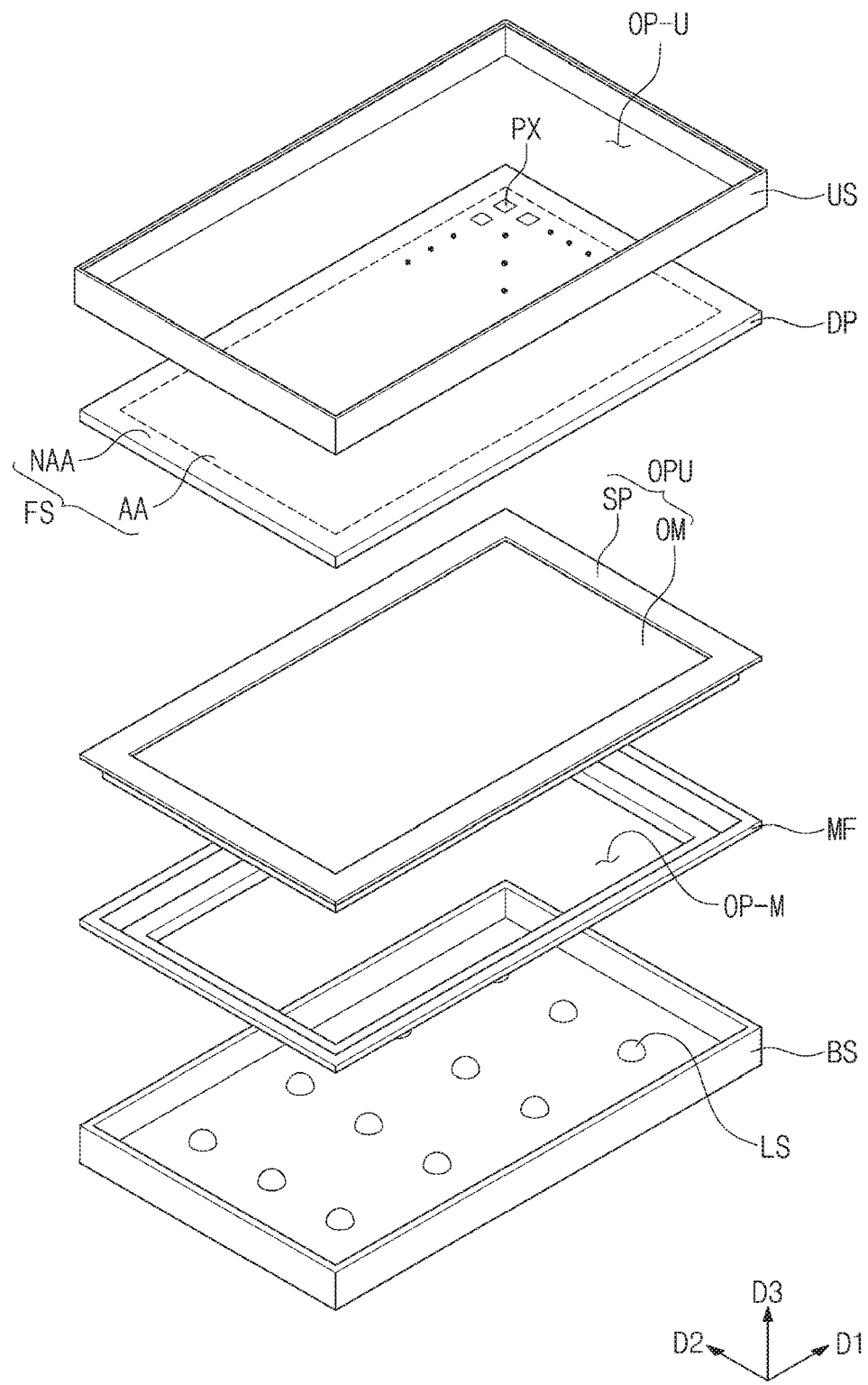
FIG. 1B is an exploded perspective view showing the display device shown in FIG. 1A.
Figure 2:
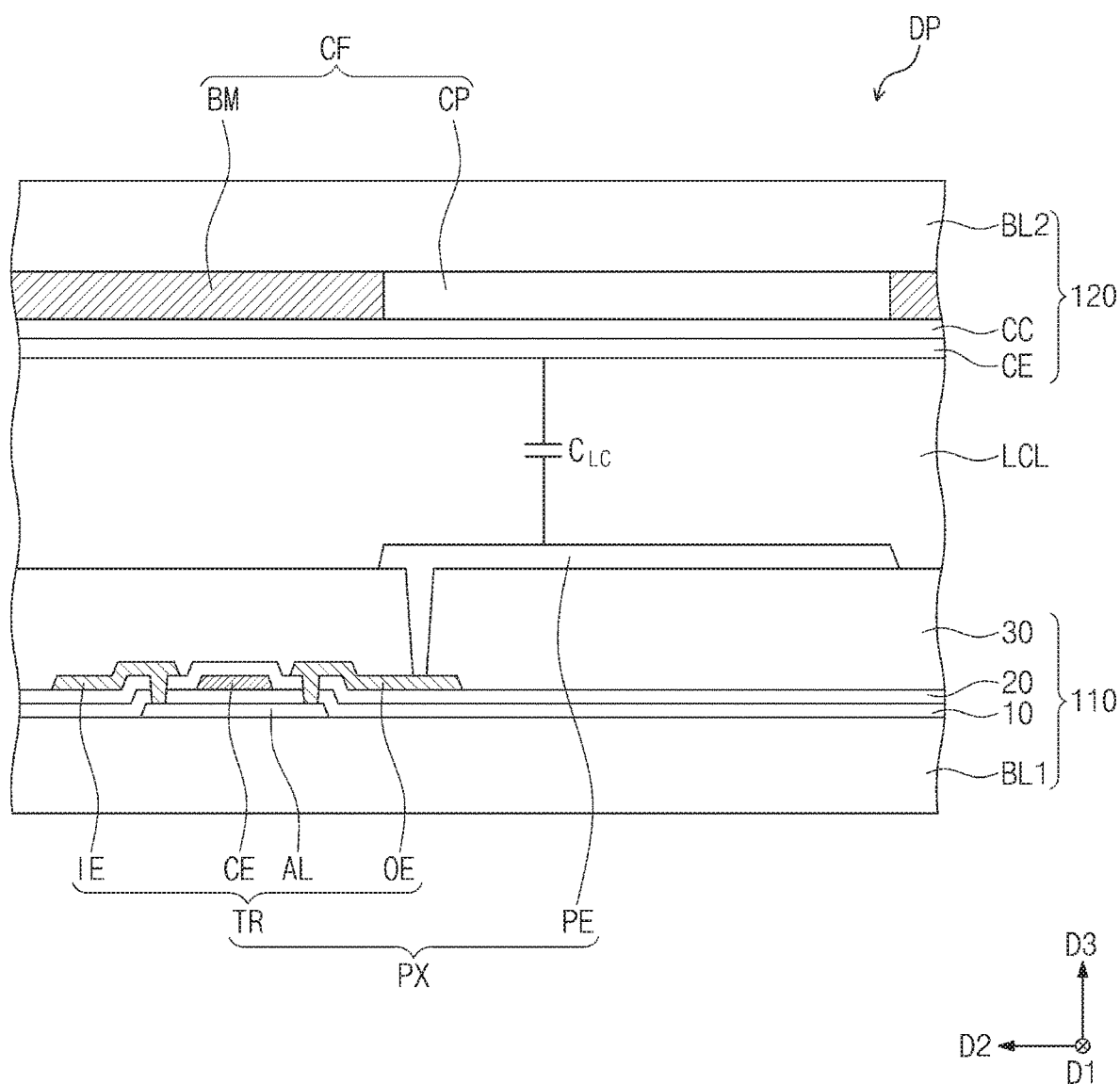
FIG. 2 is a cross-sectional view showing the display device shown in FIG. 1B.

FIG. 1A is an assembled perspective view showing a display device DA according to an embodiment of the present disclosure. FIG. 1B is an exploded perspective view showing the display device DA shown in FIG. 1A. FIG. 2 is a cross-sectional view showing the display device DA shown in FIG. 1B. Hereinafter, the present disclosure will be described with reference to FIGS. 1A to 2.

The display device DA includes a display surface FS defined by a first direction D1 and a second direction D2, and a bezel BZ. The display surface FS displays an image toward a third direction D3 (hereinafter, referred to as an "upper direction"). The bezel BZ surrounds an edge of the display surface FS. The bezel BZ may be a component that is visible to a user who sees the display surface FS.

The display device DA includes a display panel DP, an upper protective member US, a lower protective member BS, an intermediate protective member MF, an optical unit OPU, and a light source LS.

The display panel DP receives electrical signals and displays the image. The user receives information from the image provided by the display panel DP of the display device DA. The display panel DP includes the above-mentioned display surface FS.

The display surface FS is divided into an active area AA and a peripheral area NAA. The display panel DP displays the image toward the third direction D3 in the active area AA. The active area AA is activated in response to the electrical signals. The display panel DP includes a plurality of pixels PX arranged in the active area AA.

The peripheral area NAA is disposed adjacent to the active area AA. In the present exemplary embodiment, the peripheral area NAA surrounds the active area AA. Various driving circuits that apply the electrical signals to the pixels PX or pads that receive electrical signals from an external source (not shown) are arranged in the peripheral area NAA.

The type of display panel DP is not particularly limited. For example, an organic light emitting display panel, a liquid crystal display panel, a plasma display panel, an electrophoretic display panel, or an electrowetting display panel may be used as the display panel DP. In the present embodiment, the liquid crystal display panel will be described as the display panel DP.

In FIG. 2, a cross section of an area in which a pixel PX is disposed is shown as a representative example. Hereinafter, the display panel DP will be described with reference to FIG. 2. The display panel DP includes a first substrate 110, a second substrate 120, and a liquid crystal layer LCL. The first substrate 110 includes a first base layer BL1, the pixel PX, and a plurality of insulating layers 10, 20, and 30. In the present embodiment, the insulating layers 10, 20, and 30 are shown as a first insulating layer 10, a second insulating layer 20, and a third insulating layer 30, which are sequentially stacked in the third direction D3.

The first base layer BL1 includes an insulating material. As an example, the first base layer BL1 includes a glass or plastic material.

The pixel PX includes a thin film transistor TR and a pixel electrode PE. The thin film transistor TR includes a semiconductor pattern AL, a control electrode CE, an input electrode IE, and an output electrode OE. The semiconductor pattern AL is disposed between the first base layer BL1 and the first insulating layer 10. The semiconductor pattern AL includes a semiconductor material. For example, the semiconductor material includes at least one of amorphous silicon, polycrystalline silicon, crystalline silicon, oxide semiconductor, and compound semiconductor. In addition, the pixel PX includes a plurality of thin film transistors, and the thin film transistors can either include the same material as or different materials from each other, and are not limited to a specific embodiment.

The control electrode CE is disposed between the first insulating layer 10 and the second insulating layer 20. The control electrode CE is disposed spaced apart from the semiconductor pattern AL with the first insulating layer 10 interposed therebetween.

The input electrode IE and the output electrode OE are disposed between the second insulating layer 20 and the third insulating layer 30. The input electrode IE and the output electrode OE are disposed to be spaced apart from each other. Each of the input electrode IE and the output electrode OE is connected to the semiconductor pattern AL after penetrating through the first insulating layer 10 and the second insulating layer 20.

The pixel electrode PE is connected to the thin film transistor TR. The pixel electrode PE forms a liquid crystal capacitor $C_{LC}$ with a common electrode CE and the liquid crystal layer LCL. The liquid crystal capacitor $C_{LC}$ controls an alignment of liquid crystal molecules of the liquid crystal layer LCL using an electric field formed between the pixel electrode PE and the common electrode CE, and thus controls a transmittance of the liquid crystal layer LCL. The pixel PX displays an image using a light corresponding to the transmittance of the liquid crystal layer LCL.

The pixel electrode PE is disposed on the third insulating layer 30. The pixel electrode PE is connected to the thin film transistor TR after penetrating through the third insulating layer 30. Among the electrical signals, a gate signal is applied to the control electrode CE to turn on the thin film transistor TR, and a data signal is applied to the input electrode IE, output to the output electrode OE, and applied to the pixel electrode PE.

The second substrate 120 includes a second base layer BL2, a color filter layer CF, an overcoat layer CC, and the common electrode CE. The second base layer BL2 includes an insulating material. The second base layer BL2 includes, for example, a glass or plastic material.

The second base layer BL2 includes a rear surface facing the first base layer BL1 and a front surface opposite to the rear surface. The front surface is a surface in which the display surface FS (refer to FIG. 1) is defined. The color filter layer CF and the common electrode CE are disposed on the rear surface of the second base layer BL2.

The color filter layer CF includes a black matrix BM and a color pattern CP. The black matrix BM blocks a light incident thereto. The black matrix BM defines pixel areas through which the image is displayed and covers around the pixel areas to prevent a light leakage from occurring around the pixel areas.

The color pattern CP is disposed adjacent to the black matrix BM. The color pattern CP overlaps with the pixel electrode PE of the pixel PX. The color pattern CP is provided in plurality, and the color patterns CP are respectively disposed in the pixel areas. Each of the pixel areas is controlled by the liquid crystal capacitor $C_{LC}$ and corresponds to the pixel electrode PE.

The color pattern CP outputs a light incident thereto as a predetermined color light. The color pattern CP includes at least one of a dye, a pigment, an organic fluorescent substance, and an inorganic fluorescent substance. Meanwhile, in the display panel DP according to an embodiment of the present disclosure, the color filter layer CF is disposed on the first base layer BL1 and forms the first substrate 110. Alternatively, the color filter layer CF may be omitted. The color filter layer CF according to the present disclosure may be provided in various shapes, and is not particularly limited.

The overcoat layer CC covers the color filter layer CF. The overcoat layer CC includes an insulating material. The overcoat layer CC covers a rear surface of the color filter layer CF to provide a flat surface on the common electrode CE. Meanwhile, the overcoat layer CC may be omitted in the display panel DP according to another embodiment of the present disclosure.

The common electrode CE forms an electric field with the pixel electrode PE. In the present exemplary embodiment, the common electrode CE is disposed on the rear surface of the second base layer BL2 and provided in an integral shape to overlap with the pixels, however, this is merely an example. For instance, the common electrode CE may be provided in a plurality of patterns, and the patterns may be disposed in the pixel areas, respectively. Alternatively, the common electrode CE may be disposed on the first base layer BL1 to form the first substrate 110. Meanwhile, the pixel electrode PE according to the present embodiment has a shape in which no slit is formed, however, a plurality of slits may be formed in at least one of the common electrode CE and the pixel electrode PE in the display panel DP according to another embodiment of the present disclosure.

The liquid crystal layer LCL includes liquid crystal modules. The liquid crystal modules have directivity, and the alignment of the liquid crystal molecules is controlled by the electric field formed between the pixel electrode PE and the common electrode CE. The transmittance of the liquid crystal layer LCL may be controlled by the alignment of the liquid crystal molecules.

Referring to FIGS. 1A and 1B again, the upper protective member US is disposed on the display panel DP to cover at least a portion of the display panel DP. In the present embodiment, the upper protective member US covers at least a portion of the peripheral area NAA. The upper protective member US is provided with a predetermined opening OP-U defined therethrough. The opening OP-U exposes at least the active area AA to allow the image displayed through the pixels PX to be easily viewed from the outside, however, this is merely an example. The opening OP-U may be filled with a predetermined transparent member and is not particularly limited.

The lower protective member BS is disposed under the display panel DP. The lower protective member BS is coupled to the upper protective member US to define an exterior of the display device DA. The lower protective member BS and the upper protective member US accommodate the display panel DP, the intermediate protective member MF, and the optical unit OPU to protect the display panel DP, the intermediate protective member MF, and the optical unit OPU from external impacts.

The light source LS is accommodated in the lower protective member BS. The light source LS is provided in plurality, and the light sources LS are arranged on a bottom surface of the lower protective member BS. The light source LS generates the light. As an example, the light source LS includes a light emitting diode (LED), an organic light emitting diode (OLED), or a fluorescent lamp. The light emitted from the light source LS is provided to the display panel DP through the optical unit OPU.

The optical unit OPU is disposed under the display panel DP. The optical unit OPU is disposed between the light source LS and the display panel DP. The optical unit OPU converts the color of the light provided from the light source LS and provides the light having the converted color to the display panel DP. As an example, the optical unit OPU converts a blue color light to a white color light and provides the white color light to the display panel DP. In addition, the optical unit OPU allows the light to be uniformly provided to the active area AA of the display panel DP.

The optical unit OPU includes an optical member OM and a support member SP. The optical member OM is coupled to the support member SP. Detailed descriptions on the optical unit OPU will be described later.

The intermediate protective member MF is disposed between the optical unit OPU and the lower protective member BS. In the present embodiment, the intermediate protective member MF supports the optical unit OPU and the display panel DP such that the optical unit OPU and the display panel DP are spaced apart from the light source LS by a predetermined distance in the third direction D3. The intermediate protective member MF is provided with a predetermined opening OP-M defined therethrough, and thus the light emitted from the light source LS is easily transmitted to the optical unit OPU.

Figure 3A:
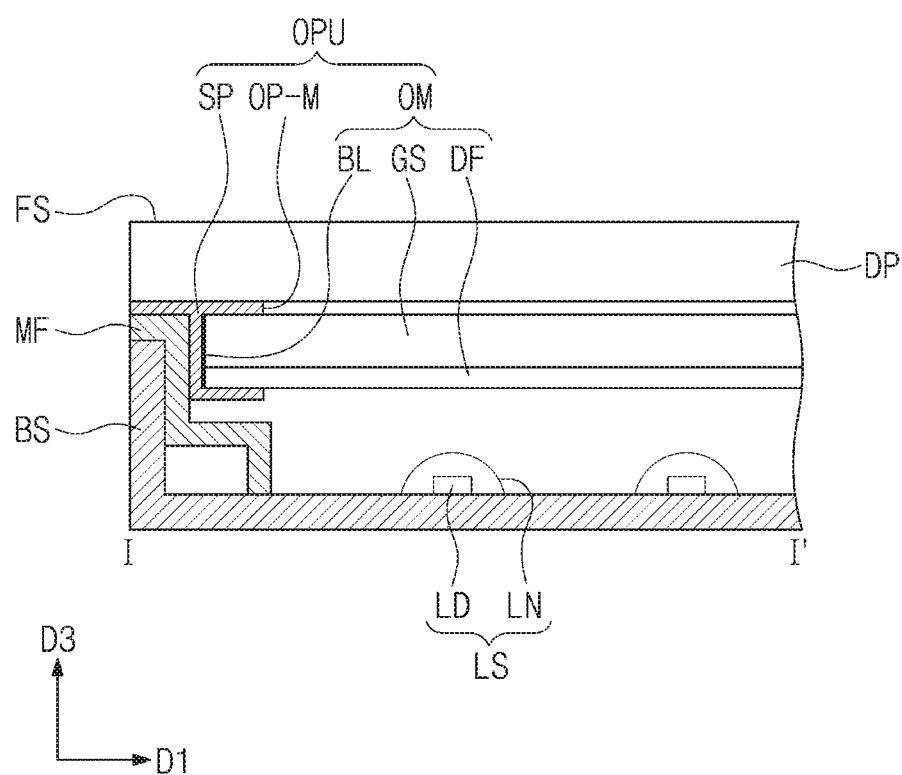
FIG. 3A is a cross-sectional view taken along a line I-I' shown in FIG. 1A.
Figure 3B:
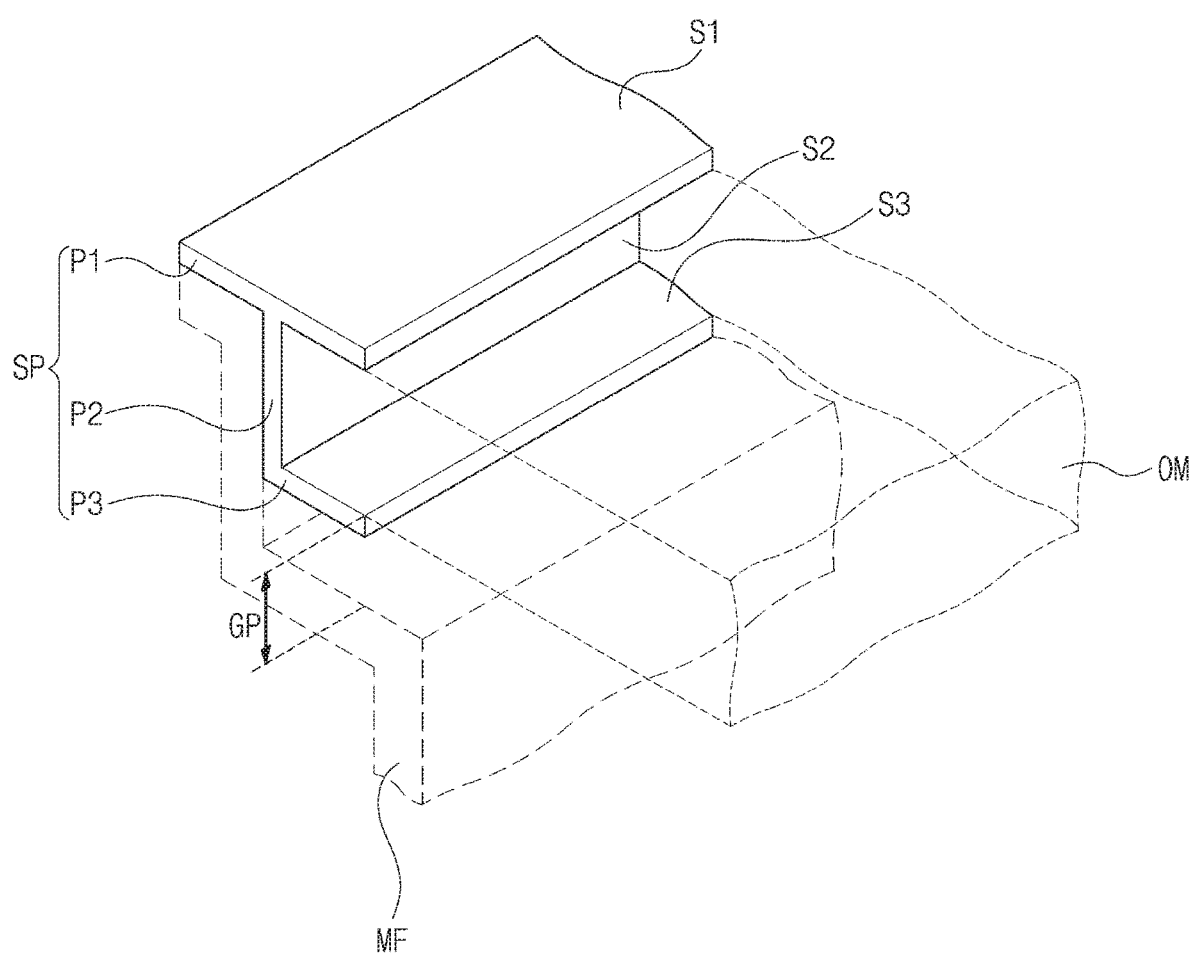
FIG. 3B is a perspective view showing a portion of components shown in FIG. 3A.
Figure 4A:
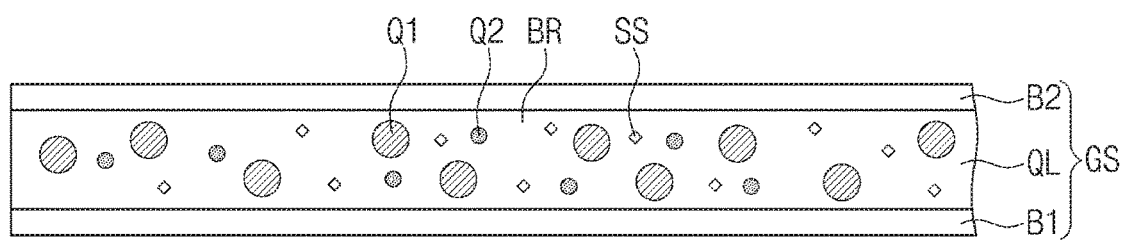
FIGS. 4A and 4B are cross-sectional views showing some of the components shown in FIG. 3B.
Figure 4B:
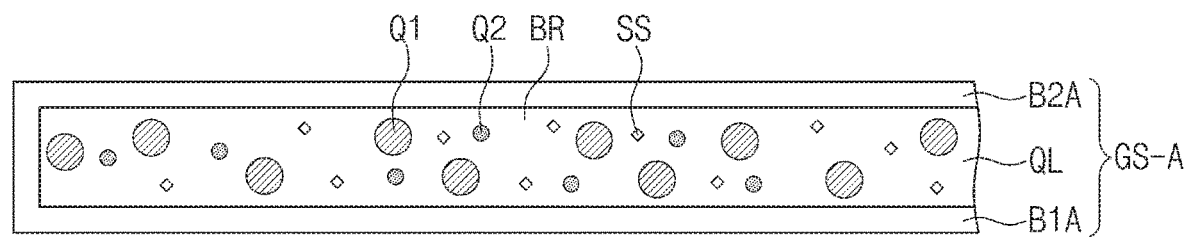

FIG. 3A is a cross-sectional view taken along a line I-I' shown in FIG. 1A. FIG. 3B is a perspective view showing a portion of components shown in FIG. 3A. FIGS. 4A and 4B are cross-sectional views showing some of the components shown in FIG. 3B. For convenience of explanation, the upper protective member US (refer to FIG. 1B) is omitted in FIG. 3A, and some components are indicated by dotted lines in FIG. 3B. Hereinafter, the present disclosure will be described in detail with reference to FIGS. 3A, 3B, 4A, and 4B.

Referring to FIG. 3A, the lower protective member BS, the intermediate protective member MF, the optical unit OPU, and the display panel DP are sequentially stacked in the third direction D3 and coupled to each other.

The light source LS is disposed in the lower protective member BS. The light source LS includes a light emitting device LD and a lens unit LN. The light emitting device LD generates light in response to the electrical signals. As an example, the light emitting device LD may include a light emitting diode (LED), an organic light emitting diode, a fluorescent substance, or a phosphorescent substance.

The lens unit LN covers the light emitting device LD. The lens LN radiates the light generated by the light emitting device LD in a radial manner. The light generated by the light emitting device LD may be emitted with a wide directivity angle through the lens unit LN. Although not shown in figures, a predetermined fluorescent substance or a scatterer may be further included in the light emitting device LD and the lens unit LN.

In the present embodiment, the light source LS generates the light having a predetermined color. The light emitted from the light source LS may be a light having a short wavelength range of a visible light. For example, the light source LS may emit the blue color light.

The optical unit OPU is supported by the intermediate protective member MF. The optical unit OPU includes the support member SP and the optical member OM. The optical member OM includes a wavelength conversion panel GS, a diffusion panel DF, and a light blocking layer BL.

The wavelength conversion panel GS converts a wavelength of the light incident thereto. As an example, the wavelength conversion panel GS may be a quantum dot panel.

Referring to FIG. 4A, the wavelength conversion panel GS includes a first layer B1, a second layer B2, and a quantum dot layer QL. The quantum dot layer QL is disposed between the first layer B1 and the second layer B2.

The quantum dot layer QL includes a base resin BR and quantum dots Q1 and Q2 mixed with (or distributed in) the base resin BR. The base resin BR is a medium in which the quantum dots Q1 and Q2 are distributed, and the base resin BR may be formed of various resin compositions generally referred to as a binder, however, the present disclosure is not limited thereto or thereby. In the present disclosure, a medium in which the quantum dots Q1 and Q2 are distributed may be referred to as the base resin BR irrespective of its name, additional other functions, materials for the medium, and the like. The base resin BR may be a polymer resin. As an example, the base resin BR may be an acrylic-based resin, a urethane-based resin, a silicon-based resin, or an epoxy-based resin. The base resin BR may be a transparent resin.

The quantum dots Q1 and Q2 may be particles to convert the wavelength of the light provided from the light source LS (refer to FIG. 1B). The quantum dots Q1 and Q2 are materials having a crystal structure of a few nanometers in size, include several hundreds to thousands of atoms, and exhibit a quantum confinement effect in which an energy band gap increases due to its small size. When a light having a wavelength higher than the band gap is incident into the quantum dots Q1 and Q2, the quantum dots Q1 and Q2 are excited by absorbing the light and fall to a ground state while emitting a light of a specific wavelength. The light of the emitted wavelength has a value corresponding to a specific band gap. When the size and composition of the quantum dots Q1 and Q2 are controlled, luminescence characteristics of the quantum dots Q1 and Q2 may be controlled by the quantum confinement effect.

The quantum dots Q1 and Q2 convert the light incident thereto to colors at different wavelength ranges. The quantum dots Q1 and Q2 may be selected from Group II-VI compounds, Group III-V compounds, Group IV-VI compounds, Group IV elements, Group IV compounds, and combinations thereof.

The Group II-VI compounds may be selected from the group consisting of a binary compound selected from the group consisting of CdSe, CdTe, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-V compounds may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The Group IV-VI compounds may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The Group IV elements may be selected from the group consisting of Si, Ge, and mixtures thereof. The Group IV compounds may be the binary compound selected from the group consisting of SiC, SiGe, and mixtures thereof.

In this case, the binary compound, the ternary compound, or the quaternary compound may be present in the particles at a uniform concentration or may be present in the same particle under a concentration distribution that is divided into partially different states.

The quantum dots Q1 and Q2 may have a core-shell structure that includes a core and a shell surrounding the core. In addition, the quantum dots Q1 and Q2 may have a core-shell structure in which one quantum dot surrounds another quantum dot. An interface between the core and the shell may have a concentration gradient in which a concentration of an element existing in the shell decreases closer to its center.

The quantum dots Q1 and Q2 may be particles each having a size of nanometer scale. The quantum dots Q1 and Q2 may have a full width of half maximum (FWHM) of an emission wavelength spectrum of about 45 nm or less, preferably about 40 nm or less, and more preferably about 30 nm or less, and may improve a color purity or a color reproducibility in this range. In addition, the light emitted from the quantum dots Q1 and Q2 travels in all directions, so that a wide viewing angle may be improved.

In addition, in light of the present disclosure one of ordinary skill in the art would understand the shape of the quantum dots Q1 and Q2 as one of a type generally used and is not particularly limited. In more detail, the quantum dots Q1 and Q2 may be a spherical, pyramidal, multi-arm, or cubic nano-particle, a nano-tube, a nano-wire, a nano-fabric, a nano-plate particle, or the like.

Meanwhile, in the present embodiment, the quantum dot layer QL may further include scattering particles SS. The scattering particles SS may be dispersed in the base resin BR with the quantum dots Q1 and Q2. The scattering particles SS scatter the light emitted from the quantum dots Q1 and Q2 to allow the light to be incident again to the quantum dots Q1 and Q2 or to allow the light to be uniformly emitted from the entire surface of the quantum dot layer QL. However, this is merely an example. The scattering particles SS may be omitted in the wavelength conversion panel GS according to other embodiments of the present disclosure.

The first layer B1 may be a support layer on which the quantum dot layer QL is disposed. The first layer B1 may include an insulating material. For example, the first layer B1 may be a glass substrate. Meanwhile, this is merely an example, and the first layer B1 may be replaced with a synthetic resin substrate that is transparent and has high heat resistance. In the present embodiment, the first layer B1 has a thickness smaller than that of the quantum dot layer QL, however, this is merely an example. That is, the first layer B1 may have a thickness similar or greater than that of the quantum dot layer QL, however, the characteristics of the first layer B1 are not limited to a specific embodiment.

In addition, although not shown in figures, the first layer B1 may have a structure in which a plurality of layers are stacked or a predetermined functional layer such as a barrier layer may be further disposed between the first layer B1 and the quantum dot layer QL, however, it is not particularly limited.

The second layer B2 is disposed on the quantum dot layer QL to cover the quantum dot layer QL. The second layer B2 protects the quantum dot layer QL from external contaminant or moisture. The second layer B2 is optically transparent and includes an insulating material. As an example, the second layer B2 may include an inorganic material, such as silicon oxide, silicon nitride, or silicon oxynitride. Alternatively, the second layer B2 may include an organic layer or may have a stack structure of organic layer/inorganic layer.

Referring to FIG. 4B, a wavelength conversion panel GS-A may include a first layer B1A and a second layer B2A, which are connected to each other. The first layer B1A and the second layer B2A are connected to each other to seal the quantum dot layer QL. Accordingly, the quantum dot layer QL may be stably protected from external contaminant or moisture.

Referring to FIG. 3A again, the diffusion panel DF is disposed under the wavelength conversion panel GS. In detail, the diffusion panel DF is disposed between the light source LS and the wavelength conversion panel GS. The diffusion panel DF diffuses the light emitted from the light source LS such that the diffused light is uniformly incident to the entire rear surface of the wavelength conversion panel GS.

The light blocking layer BL is disposed on a side surface of the wavelength conversion panel GS and a side surface of the diffusion panel DF to cover the side surfaces. The light blocking layer BL blocks the transmission of the incident light.

For example, the light blocking layer BL may include a material or a color having high light absorbance. For instance, the light blocking layer BL may have a black color. In this case, the light blocking layer BL may absorb the light exiting from the side surface of the wavelength conversion panel GS or diffusion panel DF to prevent the light exiting from the side surface of the wavelength conversion panel GS or diffusion panel DF from traveling to the outside after passing through the light blocking layer BL.

Alternatively, the light blocking layer BL may include a material having high light reflectance. As an example, the light blocking layer BL may include a metal having high reflectance. In this case, the light blocking layer BL may reflect the light exiting from the side surface of the wavelength conversion panel GS or diffusion panel DF to prevent the light exiting from the side surface of the wavelength conversion panel GS or diffusion panel DF from traveling to the outside after passing through the light blocking layer BL.

The light blocking layer BL may be directly formed on the side surface of the wavelength conversion panel GS or the side surface of the diffusion panel DF. For example, the light blocking layer BL may be printed or coated on the side surface of the wavelength conversion panel GS or the side surface of the diffusion panel DF. In this case, the light blocking layer BL, the side surface of the wavelength conversion panel GS, and the side surface of the diffusion panel DF may be coupled to each other with high coupling force. Alternatively, the light blocking layer BL may be attached to the side surface of the wavelength conversion panel GS and the side surface of the diffusion panel DF by an adhesive (not shown).

The optical member OM may be inserted into the support member SP. In detail, referring to FIG. 3B, the support member SP includes a first portion P1, a second portion P2, and a third portion P3. The first portion P1, the second portion P2, and the third portion P3 are physically connected to each other to form the support member SP having an integral shape.

The first portion P1 is substantially parallel to the display surface FS of the display panel DP. The first portion P1 is supported by the intermediate protective member MF. The first portion P1 has a frame shape that forms a predetermined opening OP-S along the intermediate protective member MF when viewed in a plan view. The first portion P1 covers a portion of the optical member OM and exposes at least a portion of the optical member OM through the opening OP-S.

The first portion P1 includes a first surface S1 facing the display panel DP. The first surface S1 supports the rear surface of the display panel DP.

The second portion P2 is connected to the first portion P1 and bent from the first portion P1. The second portion P2 extends in the third direction D3 when viewed in a cross section. The second portion P2 is substantially parallel to a plane surface defined by the second direction D2 and the third direction D3.

The second portion P2 includes a second surface S2 facing the side surface of the optical member OM. The second surface S2 makes contact with the optical member OM.

The third portion P3 is connected to the second portion P2 and bent from the second portion P2. The third portion P3 is substantially parallel to the first portion P1.

The third portion P3 includes a third surface S3 facing the rear surface of the optical member OM. The third surface S3 supports at least a portion of the optical member OM.

The first portion P1, the second portion P3, and the third portion P3 are connected to each other to define a predetermined space. The space is a space in which the second surface S2 faces the third surface S3. At least a portion of the optical member OM is inserted into the predetermined space, which is defined by the first portion P1, the second portion P2, and the third portion P3, and is coupled to the support member SP.

In the present embodiment, the optical member OM may be coupled to the support member SP while being separated from the intermediate protective member MF by a predetermined gap GP in the third direction D3. The support member SP supports the optical member OM using the third portion P3, and thus the gap GP between the optical member OM and the intermediate protective member MF may be stably maintained. Accordingly, a gap between the light source LS and the optical member OM is stably maintained. Therefore, even though a separate supporter disposed between the light sources to support the rear surface of the optical member OM is omitted, a distance between the light source LS and the optical member OM is appropriately maintained such that the light emitted from the light source LS is uniformly provided to the optical member OM.

According to the present disclosure, since the display device includes the optical member OM, the colored light may be uniformly provided to the display panel DP. In addition, the display device includes the light blocking layer BL, and thus a leakage phenomenon occurring on the side surfaces of the diffusion panel DF or the quantum dot layer QL may be easily prevented.

In addition, according to the present disclosure, the display device further includes the support member SP, and thus the distance between the light source LS and the optical member OM may be appropriately maintained even though the separate supporter is not disposed between the light sources. Thus, the assemblability and the light efficiency of the display device may be improved.

Figure 5A:
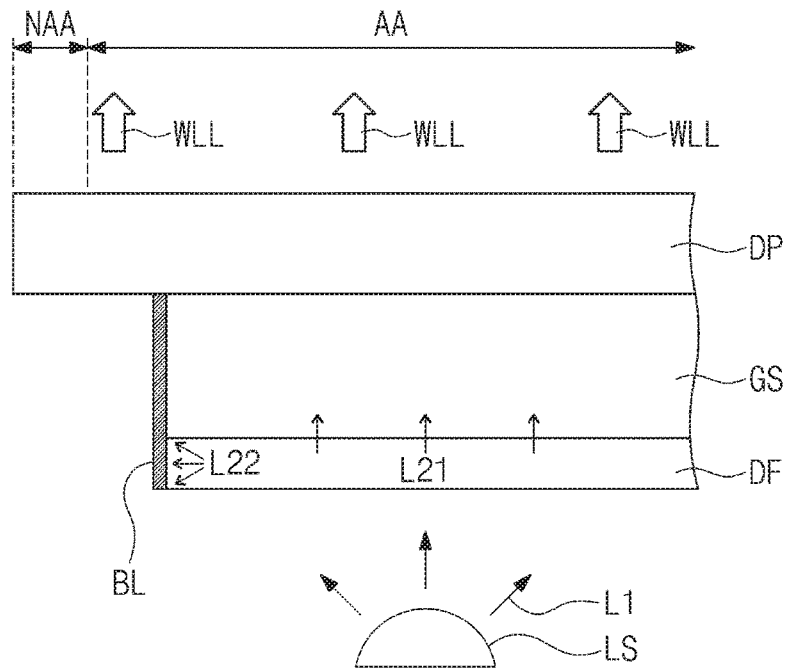
FIG. 5A is a cross-sectional view showing a portion of a display device according to an exemplary embodiment of the present disclosure.
Figure 5B:
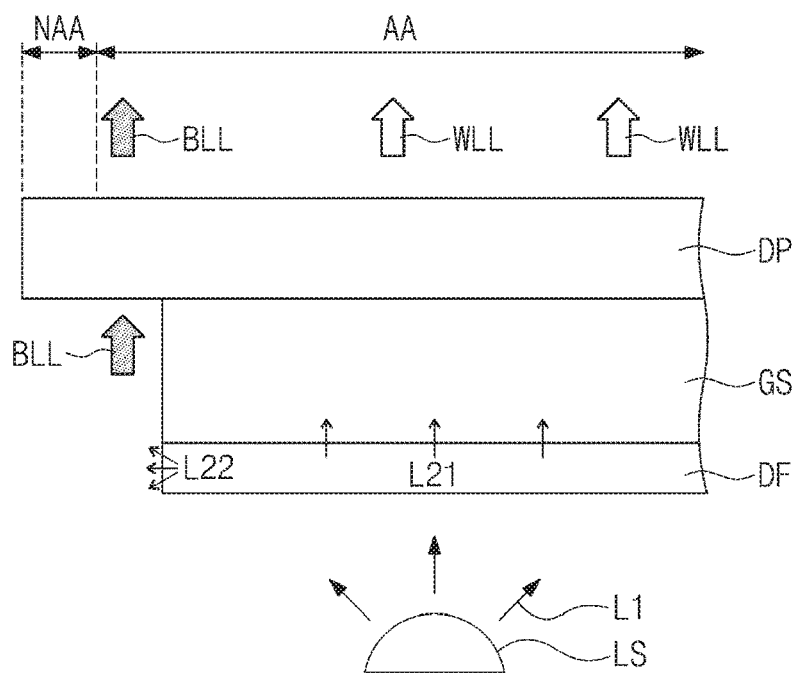
FIG. 5B is a cross-sectional view showing a portion of a display device according to a comparison embodiment.
Figure 5C:
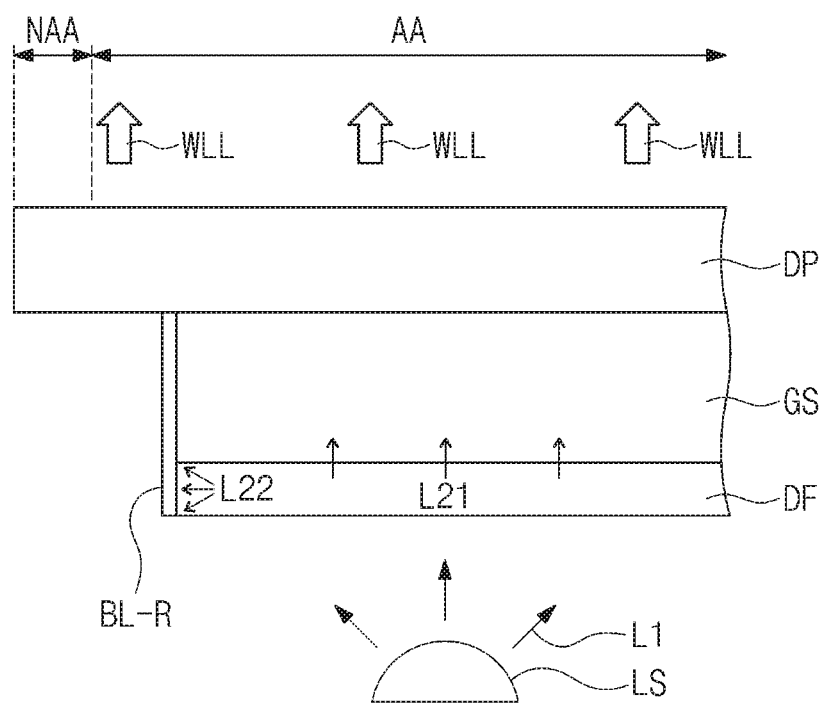
FIG. 5C is a cross-sectional view showing a portion of a display device according to an exemplary embodiment of the present disclosure.

FIG. 5A is a cross-sectional view showing a portion of a display device according to an embodiment of the present disclosure. FIG. 5B is a cross-sectional view showing a portion of a display device according to a comparative example. FIG. 5C is a cross-sectional view showing a portion of a display device according to another embodiment of the present disclosure. FIG. 5B shows the comparative example from which the light blocking layer BL is omitted. Hereinafter, the present disclosure will be described with reference to FIGS. 5A to 5C. In FIGS. 5A to 5C, the same reference numerals denote the same elements in FIGS. 1A to 4B, and thus detailed descriptions of the same elements will be omitted.

Referring to FIG. 5A, a first light L1 emitted from the light source LS is provided to the display panel DF in the display device according to an embodiment of the present disclosure. A portion L21 of the light L1 provided to the diffusion panel DF is provided to the wavelength conversion panel GS. The wavelength of the light is converted by the wavelength conversion panel GS, and then the converted light is provided to the display panel DP.

The other portion L22 of the light L1 provided to the diffusion panel DF travels toward the side surface of the diffusion panel DF. In this case, the light blocking layer BL includes the material having high light absorbance. The light L22 directed to the side surface of the diffusion panel DF is absorbed by the light blocking layer BL and is not emitted to the outside. Accordingly, the white color light WLL may also be provided to an area of the active area AA overlapping with the outside of the diffusion panel DF.

Different from the above, referring to FIG. 5B, the comparative example does not include the light blocking layer BL. Accordingly, the light L22 directed to the side surface of the diffusion panel DF leaks from the diffusion panel DF and is provided to the display panel DP without passing through the wavelength conversion panel GS. Therefore, the blue color light BLL may be provided to a portion of the active area AA, and thus the display characteristics of the display panel DP is deteriorated.

Referring to FIG. 5C, a light blocking layer BL-R according to another embodiment of the present disclosure may include the material having high light reflectance. In this case, the light L22 directed to the side surface of the diffusion panel DF may be incident again into the diffusion panel DF or may be provided to the wavelength conversion panel GS after being reflected by the light blocking layer BL-R. Accordingly, a recycling effect of the light L22 directed to the side surface of the diffusion panel DF may be improved and the display characteristics of the display panel DP may be improved.

In a case where the area of the peripheral area NAA decreases and the side surface of the optical member OM overlaps with the active area AA, the light leaking from the side surface of the optical member OM may exert an influence on the display characteristics of the active area AA. According to the present disclosure, since the display device further includes the light blocking layers BL and BL-R, a light path through which the light leaking from the side surface of the optical member OM is directly provided to the display panel DP without passing through the wavelength conversion member GS may be blocked. As the display device further includes the light blocking layers BL and BL-R, the light efficiency of the optical member may be improved. In addition, since the color light is uniformly provided to the entire surface of the active area AA of the display panel DP, the image may be uniformly displayed through the entire surface of the active area AA even though the area of the peripheral area NAA decreases or the area of the active area AA increases.

Figure 6A:
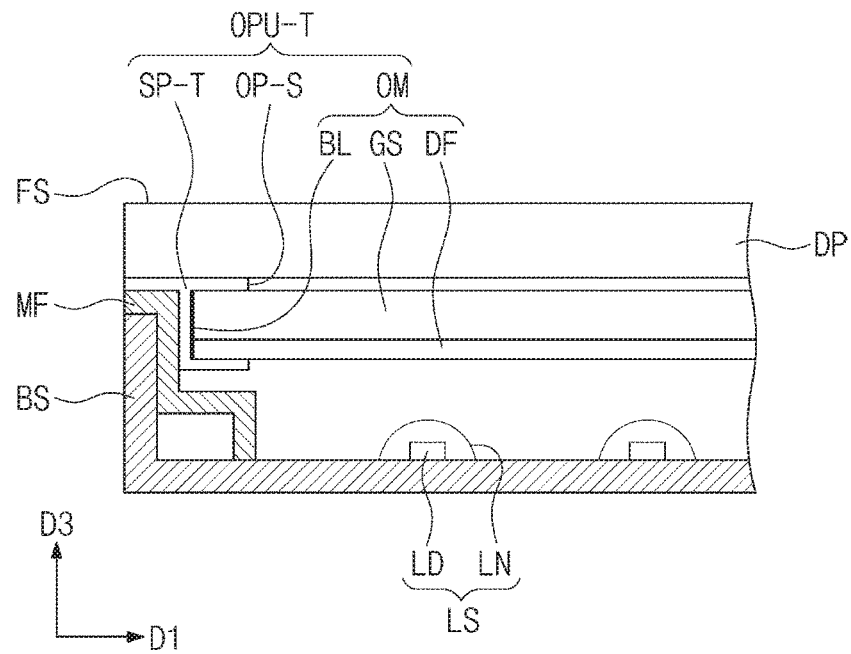
FIGS. 6A and 6B are cross-sectional views showing a display device according to an exemplary embodiment of the present disclosure.
Figure 6B:
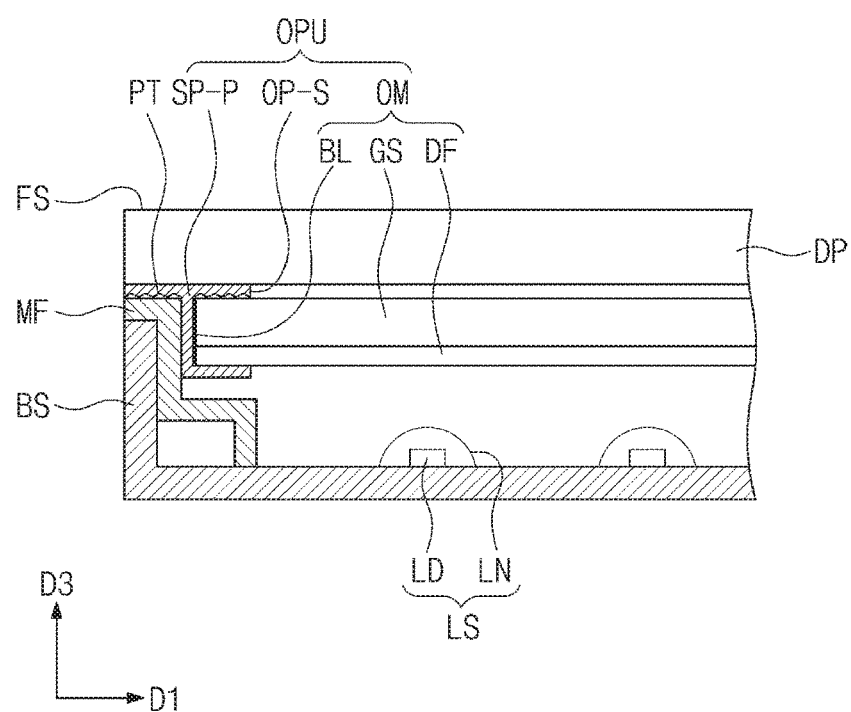

FIGS. 6A and 6B are cross-sectional views showing a display device according to an embodiment of the present disclosure. For convenience of explanation, FIGS. 6A and 6B show an area corresponding to the area shown in FIG. 3A. Hereinafter, the present disclosure will be described with reference to FIGS. 6A and 6B. In FIGS. 6A and 6B, the same reference numerals denote the same elements in FIGS. 1A to 5C, and thus detailed descriptions of the same elements will be omitted.

Referring to FIG. 6A, a support member SP-T of an optical unit OPU-T may be optically transparent. Accordingly, a portion of the light provided from a light source LS, which is directed to a portion of the support member SP-T, e.g., the third portion P3 (refer to FIG. 3B) covering the rear surface of the diffusion panel DF, may easily reach the rear surface of the diffusion panel DF after passing through the support member SP-T. Therefore, the light may stably reach a portion covered by the support member SP-T, and thus the light efficiency may be improved.

Alternatively, as shown in FIG. 6B, a support member SP-P of an optical unit OPU may further include a pattern portion PT as compared with the support member SP shown in FIG. 3A. The pattern portion PT may be defined in a lower surface of the first portion P1 (refer to FIG. 3B) of the support member SP-P. The pattern portion PT decreases the flatness of the lower surface of the first portion. The pattern portion PT changes the path of the incident light. Accordingly, a portion of the light directed to the pattern portion PT is incident again into the optical member OM and provided to the display panel DP. According to the present disclosure, the display device includes the support member SP-P having the pattern portion PT, and thus the light efficiency of the display device may be improved.

Figure 7:
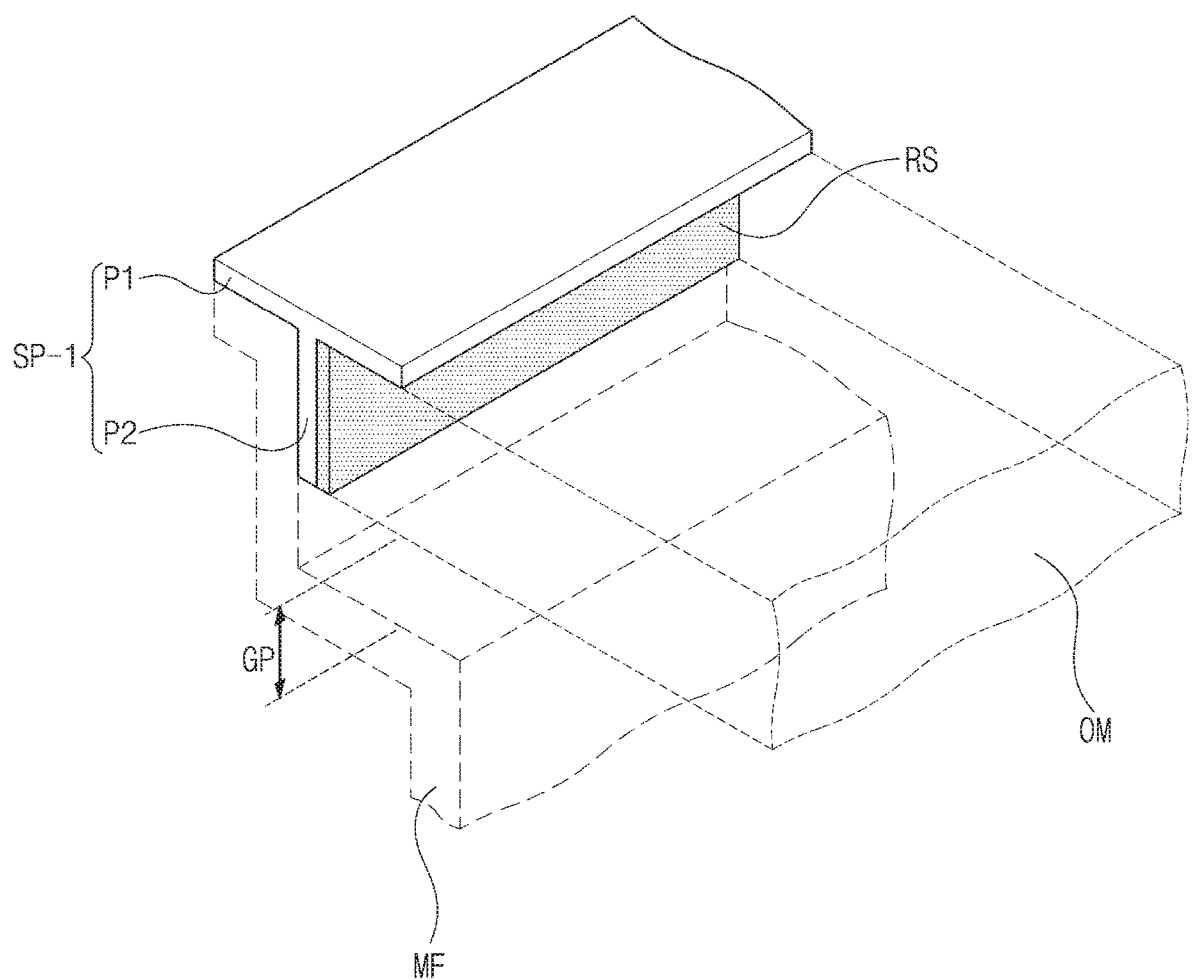
FIG. 7 is a perspective view showing some components of a display device according to an exemplary embodiment of the present disclosure.

FIG. 7 is a perspective view showing some components of a display device according to an embodiment of the present disclosure. For convenience of explanation, FIG. 7 shows an area corresponding to the area shown in FIG. 3B. In FIG. 7, the same reference numerals denote the same elements in FIGS. 1A to 6B, and thus detailed descriptions of the same elements will be omitted.

Referring to FIG. 7, a portion, e.g., the third portion P3 (refer to FIG. 3B), may be omitted from a support member SP-1. Accordingly, the support member SP-1 may include only a first portion P1 and a second portion P2. In the present embodiment, a rear surface of an optical member OM is fully exposed without being covered by the support member SP-1, and thus the optical member OM may easily receive a light from a light source (not shown) through the entire rear surface thereof.

Meanwhile, in the present embodiment, the display device may further include an adhesive member RS. The adhesive member RS is disposed on the second surface S2 (refer to FIG. 3B) of the second portion P2 to cover the second surface. The adhesive member RS has a predetermined adhesive force.

The adhesive member RS physically couples the support member SP-1 and the optical member OM. Therefore, although the rear surface of the optical member OM is not supported by the support member SP-1, the side surface of the optical member OM is coupled to the support member SP-1 by the adhesive member RS, and thus a gap GP between the optical member OM and the intermediate protective member MF may be stably maintained.

Figure 8A:
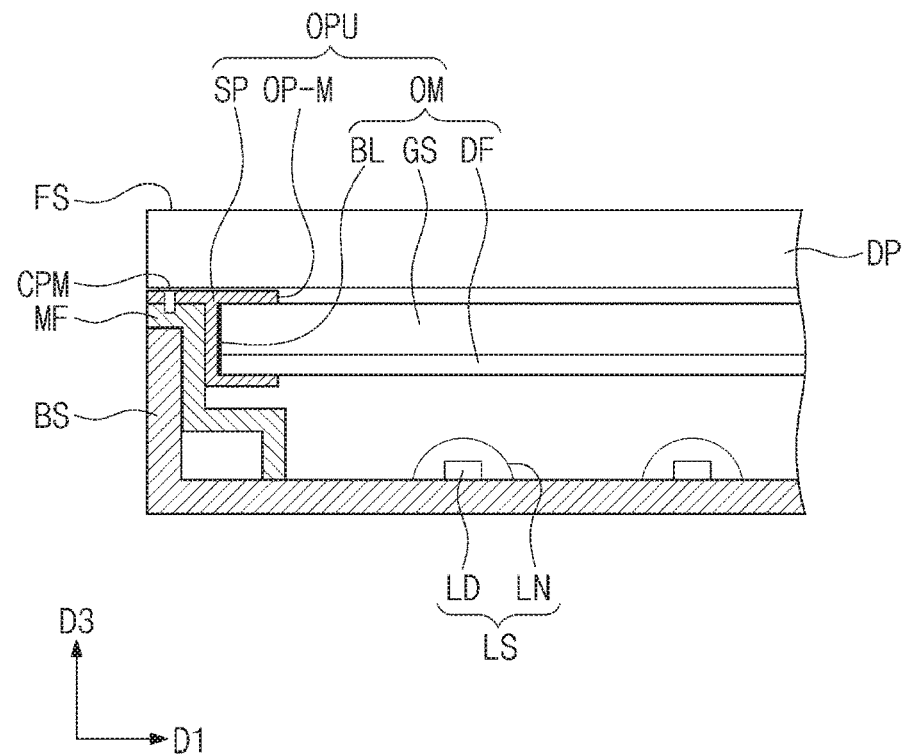
FIGS. 8A and 8B are cross-sectional views showing a portion of a display device according to an exemplary embodiment of the present disclosure.
Figure 8B:
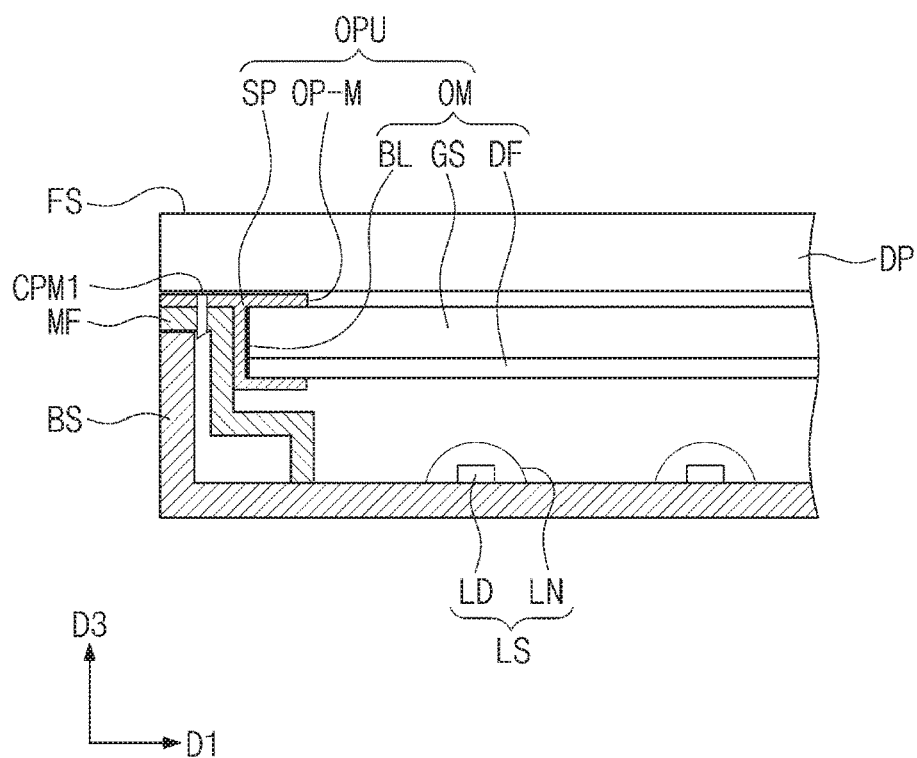

FIGS. 8A and 8B are cross-sectional views showing a portion of a display device according to an embodiment of the present disclosure. For convenience of explanation, FIGS. 8A and 8B show an area corresponding to the area shown in FIG. 3A. Hereinafter, the present disclosure will be described with reference to FIGS. 8A and 8B. In FIGS. 8A and 8B, the same reference numerals denote the same elements in FIGS. 1A to 7, and thus detailed descriptions of the same elements will be omitted.

Referring to FIG. 8A, the display device may further include a coupling member CPM. The coupling member CPM may physically couple a support member SP and an intermediate protective member MF. The coupling member CPM includes a bolt and a nut. The coupling member CPM penetrates through the support member SP and are inserted into the intermediate protective member MF to couple the intermediate protective member MF and the support member SP.

In another embodiment, referring to FIG. 8B, a coupling member CPM1 penetrates a portion of the support member SP and a portion of the intermediate protective member MF to couple the support member SP and the intermediate protective member MF. Since the coupling member CPM1 penetrates through the intermediate protective member MF, a coupling force between the support member SP and the intermediate protective member MF may be improved.

Meanwhile, the coupling member CPM1 may be provided as a hook. Therefore, even though the separate nut is not present, the support member SP may be stably engaged with the intermediate protective member MF. However, this is merely an example, and the coupling member CPM and CPM1 may include an adhesive member disposed between the intermediate protective member MF and the support member SP. The adhesive member may stably couple the intermediate protective member MF and the support member SP without penetrating through the intermediate protective member MF or the support member SP.

The display device according to the embodiment of the present disclosure further includes the coupling members CPM and CPM1 to physically couple the optical unit OPU and the intermediate protective member MF. The coupling members CPM and CPM1 prevent the optical unit OPU and the intermediate protective member MF from being separated from each other due to external impacts applied to the display device from the outside, and thus the reliability of the display device may be improved.

Figure 9A:
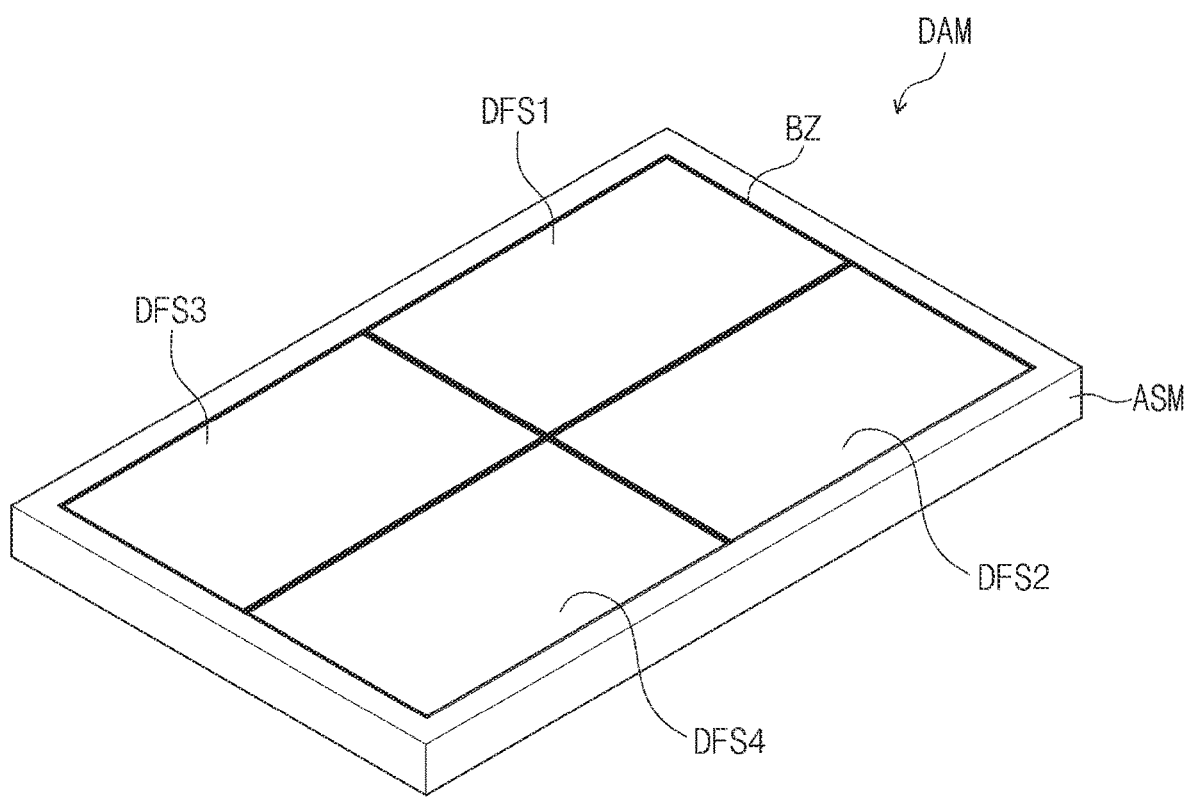
FIG. 9A is an assembled perspective view showing an electronic apparatus according to an exemplary embodiment of the present disclosure.
Figure 9B:
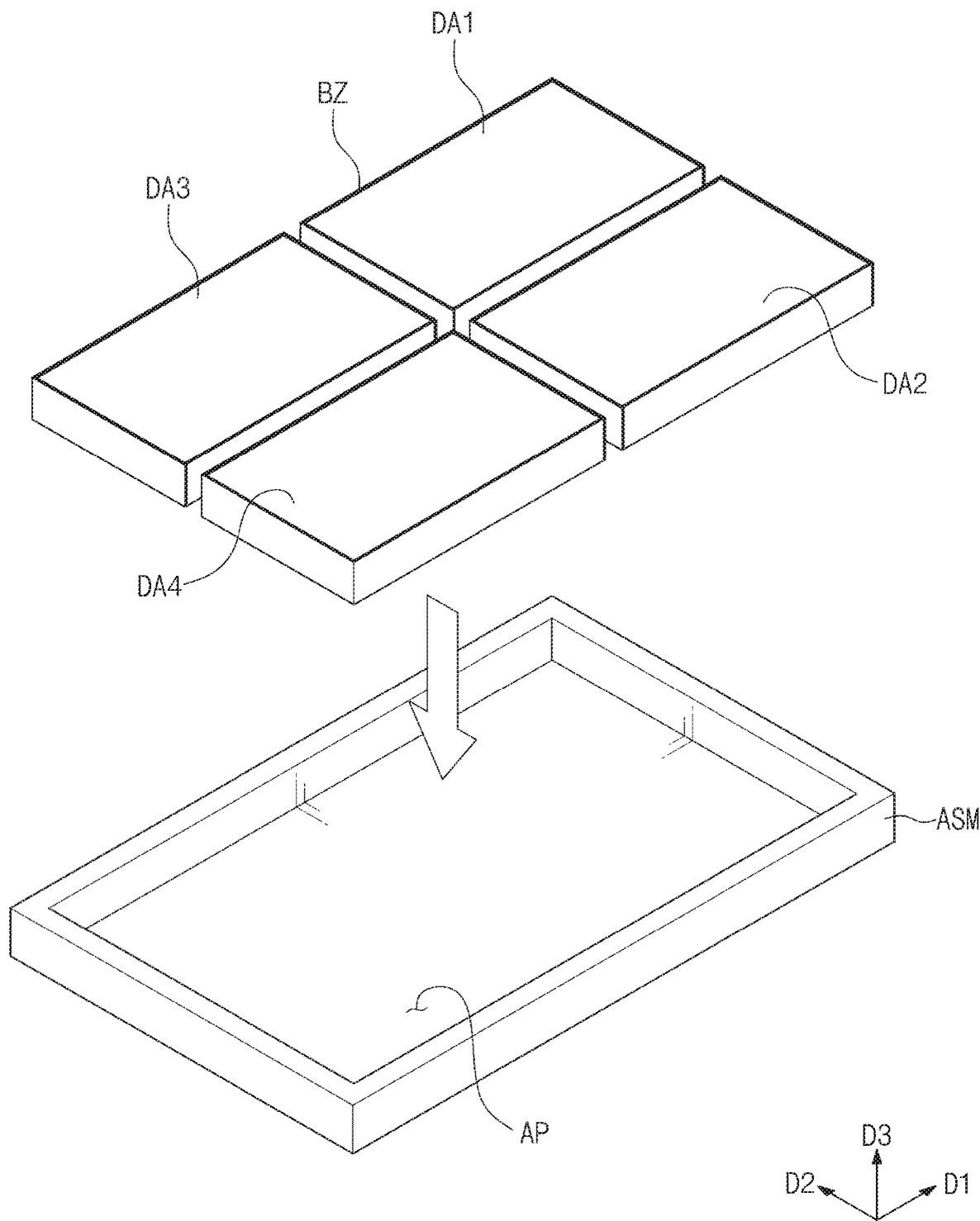
FIG. 9B is an exploded perspective view showing the electronic apparatus shown in FIG. 9A.

FIG. 9A is an assembled perspective view showing an electronic apparatus DAM according to an embodiment of the present disclosure. FIG. 9B is an exploded perspective view showing the electronic apparatus DAM shown in FIG. 9A. Hereinafter, the present disclosure will be described with reference to FIGS. 9A and 9B. In FIGS. 9A and 9B, the same reference numerals denote the same elements in FIGS. 1A to 8B, and thus detailed descriptions of the same elements will be omitted.

The electronic apparatus DAM according to the embodiment of the present disclosure may include a plurality of display surfaces arranged adjacent to each other in a plan view. In the present embodiment, the electronic apparatus DAM includes first, second, third, and fourth display surfaces DFS1, DFS2, DFS3, and DFS4. The first display surface DFS1 and the second display surface DFS2 are arranged adjacent to each other in the first direction D1, the third display surface DFS3 is arranged adjacent to the first display surface DFS1 in the second direction D2, and the fourth display surface DFS4 is arranged adjacent to the second display surface DFS2 in the second direction D2.

Referring to FIG. 9A, the electronic apparatus DAM may include a plurality of display devices. The electronic apparatus DAM may include first, second, third, and fourth display devices DA1, DA2, DA3, and DA4 and an accommodating member ASM. The first, second, third, and fourth display devices DA1, DA2, DA3, and DA4 provide the first, second, third, and fourth display surfaces DFS1, DFS2, DFS3, and DFS4, respectively.

The accommodating member ASM provides an accommodating space AP whose upper side is opened. The first, second, third, and fourth display devices DA1, DA2, DA3, and DA4 are accommodated in the accommodating space AP along an arrow direction as illustrated, so that they are provided as a single electronic apparatus DAM.

As shown in FIG. 9B, each of the first, second, third, and fourth display devices DA1, DA2, DA3, and DA4 may include a narrow bezel BZ defined by a side protective member. Accordingly, a visibility of boundaries between the first, second, third, and fourth display surfaces DFS1, DFS2, DFS3, and DFS4 provided by the first, second, third, and fourth display devices DA1, DA2, DA3, and DA4 may be lowered. According to the present disclosure, the first, second, third, and fourth display surfaces DFS1, DFS2, DFS3, and DFS4 may provide an image as a single display surface without any discrepancy therebetween, and thus the electronic apparatus DAM, which easily implements a large-area image, may be easily provided.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein.

What is claimed is:

1. A display device comprising:
   a display panel comprising a display surface that is divided into an active area configured to display an image and a peripheral area disposed adjacent to the active area;
   a light source configured to provide a light to the display panel; an optical member disposed between the light source and the display panel;
   a light blocking layer covering a side surface of the optical member;
   a support member directly supporting the optical member and the display panel; and
   an intermediate protective member disposed between the display panel and the light source to support the display panel, the support member being supported by the intermediate protective member.

2. The display device of claim 1, wherein the support member comprises:
   a first portion covering a portion of an upper surface of the optical member; and
   a second portion connected to the first portion and extending along the side surface of the optical member, and wherein the light blocking layer faces the first portion.

3. The display device of claim 2, wherein the support member further comprises a third portion extended from the second portion and substantially parallel to the first portion, and at least a portion of the optical member is inserted into a predetermined space defined by the first portion, the second portion, and the third portion.

4. The display device of claim 3, wherein the third portion is optically transparent.

5. The display device of claim 2, further comprising an adhesive member disposed on the second portion to make contact with the light blocking layer, wherein the adhesive member couples the support member and the optical member.

6. The display device of claim 2, wherein the support member further comprises a pattern portion disposed on a rear surface of the first portion.

7. The display device of claim 1, wherein the light blocking layer has a black color.

8. The display device of claim 1, wherein the light blocking layer is configured to reflect a light incident thereto.

9. The display device of claim 1, wherein the light blocking layer is printed or coated on the side surface of the optical member.

10. The display device of claim 1, wherein the optical member comprises a wavelength conversion panel, and the light blocking layer covers a side surface of the wavelength conversion panel.

11. The display device of claim 10, wherein the wavelength conversion panel comprises a glass substrate.

12. The display device of claim 10, wherein the optical member further comprises a diffusion panel disposed between the wavelength conversion panel and the light source, and the light blocking layer covers the side surface of the wavelength conversion panel and a side surface of the diffusion panel.

13. The display device of claim 1, wherein the light source is configured to generate a blue color light.

14. The display device of claim 1, wherein the side surface of the optical member overlaps with the active area when viewed in a plan view.

15. An electronic apparatus comprising:
   a plurality of display devices arranged adjacent to each other, each of the display devices comprising:
   a display panel that is divided into an active area configured to display an image and a peripheral area disposed adjacent to the active area in a plan view;
   a light source configured to provide a first light to the display panel; and
   an optical unit disposed between the light source and the display panel, the optical unit comprising:
      an optical member configured to convert the first light to a second light having a different color from that of the first light;
      a support member supporting the optical member such that the optical member is spaced apart from the light source by a predetermined gap; and
      a light blocking layer directly disposed on a side surface of the optical member.

16. The electronic apparatus of claim 15, wherein the support member comprises:

a first portion covering a portion of an upper surface of the optical member;

a second portion covering the side surface of the optical member; and a third portion covering a portion of a rear surface of the optical member, and at least a portion of the optical member is inserted into a predetermined space defined by the first portion, the second portion, and the third portion.

17. The electronic apparatus of claim 16, wherein the third portion is optically transparent.

18. The electronic apparatus of claim 15, wherein the optical unit further comprises an adhesive member to couple the support member and the optical member, the support member comprises:

a first portion covering a portion of an upper surface of the optical member; and a second portion covering the side surface of the optical member, and the adhesive member is coupled to the second portion.

19. The electronic apparatus of claim 15, wherein the light blocking layer has a black color.

\* \* \* \* \*